(12) United States Patent
Park et al.

(10) Patent No.: US 7,629,788 B2
(45) Date of Patent: Dec. 8, 2009

(54) TEST CARRIER

(75) Inventors: Jong-Pil Park, Chungcheongnam-do (KR); Jong-Won Han, Chungcheongnam-do (KR); Woon-Chan Shin, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/204,627

(22) Filed: Sep. 4, 2008

(65) Prior Publication Data

US 2009/0140758 A1 Jun. 4, 2009

(30) Foreign Application Priority Data

Dec. 3, 2007 (KR) .................... 10-2007-0124180

(51) Int. Cl.
*G01R 31/02* (2006.01)
(52) U.S. Cl. .................................... 324/158.1; 324/755
(58) Field of Classification Search ........................ None
See application file for complete search history.

(56) References Cited

U.S. PATENT DOCUMENTS

| 4,378,139 | A | * | 3/1983 | Griffin et al. ................. 439/331 |
|---|---|---|---|---|
| 4,881,639 | A | * | 11/1989 | Matsuoka et al. ............. 206/724 |
| 5,573,427 | A | * | 11/1996 | Sagano ........................ 439/526 |
| 5,742,487 | A | * | 4/1998 | Kobayashi et al. ........... 361/809 |
| 6,873,169 | B1 | * | 3/2005 | Ham et al. ................... 324/755 |
| 7,253,653 | B2 | * | 8/2007 | Ham et al. ................... 324/765 |

FOREIGN PATENT DOCUMENTS

| JP | 2002-257900 | 9/2002 |
|---|---|---|
| KR | 1998-69436 | 10/1998 |
| KR | 2004-0029563 | 4/2004 |

* cited by examiner

*Primary Examiner*—Minh N Tang
(74) *Attorney, Agent, or Firm*—Marger Johnson & McCollom, P.C.

(57) ABSTRACT

A test carrier includes an insert body, a first latch assembly including one or more first latches pivotally attached to the insert body, and a second latch assembly including one or more second latches pivotally attached to the insert body. The second latch assembly is configured to engage with an external connection terminal array of an electronic component during testing thereof. A method of testing a semiconductor device and a system for testing a semiconductor device are also provided.

11 Claims, 11 Drawing Sheets

TEST CARRIER

CROSS-REFERENCE TO RELATED PATENT APPLICATION

This application claims priority under 35 USC § 119 to Korean Patent Application No. 2007-124180, filed on Dec. 3, 2007 in the Korean Intellectual Property Office, the disclosure of which is incorporated herein in its entirety by reference.

BACKGROUND

1. Technical Field

The present invention relates to an apparatus for testing electronic components including semiconductor dies or semiconductor packages, and more particularly to a test carrier for testing the same.

2. Description of the Related Art

In general, semiconductor packages or semiconductor dies are tested for defects and/or electrical characteristics prior to shipment to customers. This testing is typically done on a tester that is capable of evaluating many semiconductor packages simultaneously. Therefore, the tester utilizes a test carrier board that holds many semiconductor packages simultaneously. The test carrier board is used to position the semiconductor packages or semiconductor devices, also referred to as devices under test (DUTs), over a test head which individually engages with external contact terminals of the semiconductor packages through a plurality of test probes. The tester head generates test signals to test the electrical characteristics of the semiconductor packages. The test signals are transmitted to the semiconductor packages via test probes.

The test carrier board typically includes a plurality of test carriers that each receive an individual semiconductor package. As semiconductor packages have been shrinking in response to consumer demand, the area available on the semiconductor package to engage with the test carrier is correspondingly decreased. Further, if the test carrier is not able to reliably engage with a semiconductor package and hold the package in a fixed position, the test head may not make good connections with all of the external connection terminals. This may cause the semiconductor device in the package to be identified as a reject, when in fact the semiconductor device is not defective. Thus, conventional test carriers can result in a reduction in yield that is not due to actual defects. Consequently, a need remains for a test carrier that is capable of reliably engaging semiconductor packages with small dimensions as explained below.

FIG. 1 is a plan view and a side view of a conventional BGA type semiconductor package. As shown in FIG. 1, a conventional BGA type package 50 includes a plurality of external connection terminals 45 disposed in an array below an encapsulated semiconductor device 40. In order to meet demand for smaller and/or thinner semiconductor packages, the overall dimensions of the encapsulated semiconductor device are continually decreasing. Therefore, a distance (dimension A in FIG. 1) between the edge of the encapsulation (or the edge of the semiconductor package) and the edge of the external connection terminal array (or an outermost portion of the external connection terminal array) is correspondingly decreasing.

FIG. 2 is a cross-sectional view of an exemplary conventional test carrier and a test head. As shown in FIG. 2, a conventional test carrier 10 includes only a single set of latches 20 that engage a DUT on a single surface. Thus, the opposite surface of the semiconductor package must engage with a shelf 12 on the test carrier 10.

FIG. 3 is an expanded view of a shelf in a conventional test carrier. As shown in FIG. 3, a conventional test carrier 10 includes a shelf 12 that engages with a lower surface of a semiconductor package. The shelf 12 must engage with a sufficient portion of the lower surface of the semiconductor package such that the semiconductor package can be adequately supported by the shelf. Also, the shelf 12 should not contact the external connection terminals 45 because the shelf 12 may damage the external connection terminals 45, or the shelf 12 may prevent proper contact between the external connection terminals 45 and a test head during the testing operation. If the shelf 12 damages the external connection terminals 45, the semiconductor package will be defective and unusable. If the shelf 12 prevents contact between the test head and the external connection terminals 45, the semiconductor package may be wrongly classified as defective, when in fact the semiconductor package is not defective. Both of these situations result in a reduction in yield and a corresponding increase in manufacturing costs. Therefore, a minimum distance A is required between the edge of the external connection terminal array and the edge of the encapsulation of the semiconductor package to ensure that the shelf 12 of the conventional test carrier 10 provides adequate support for the semiconductor package and does not contact the external connection terminals 45. However, as the size of the semiconductor package continues to decrease, in order to meet consumer demand, securing the minimum distance A becomes difficult, if not impossible, to achieve. In some instances, the semiconductor package falls through the test carrier due to in sufficient support area (very small minimum distance A). Consequently, it becomes difficult to test the modern semiconductor packages with the conventional test carriers discussed above.

Therefore, a novel test carrier is needed that provides adequate support for a semiconductor package but does not require a minimum distance between the edge of the external connection terminal array and the edge of the encapsulation of the semiconductor package. The present invention addresses these and other disadvantages of the conventional art.

SUMMARY

The present invention provides a test carrier for testing a semiconductor device and a method for testing semiconductor devices using the test carrier. The test carrier according to some embodiments of the invention includes an insert body; a first latch assembly including one or more first latches pivotally attached to the insert body; and a second latch assembly including one or more second latches pivotally attached to the insert body, wherein the second latch assembly is configured to engage with an external connection terminal array of an electronic component to be tested.

The first latch assembly can be open to load the semiconductor device while the second latch assembly is closed. Then, the second latch assembly can be open for testing of the semiconductor device while the first latch assembly is closed. The test carrier can be rotated between loading and testing so that the semiconductor device can be loaded with external connection terminals facing down and tested with the external connection terminals facing up. The test carrier according to some embodiments of the invention enables testing of semiconductor devices without having to secure a minimum distance between external connection terminals and the edge of the semiconductor package, thereby preventing damage to the external connection terminals or open connections during testing.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION

Figure 1:
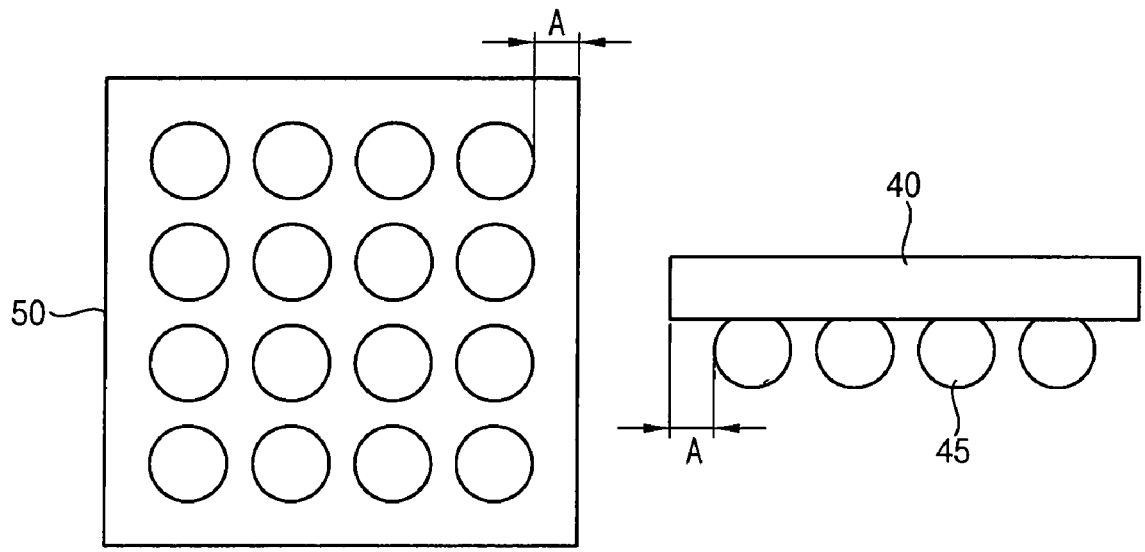
FIG. 1 is a plan view and a side view of a conventional BGA type semiconductor package.
Figure 2:
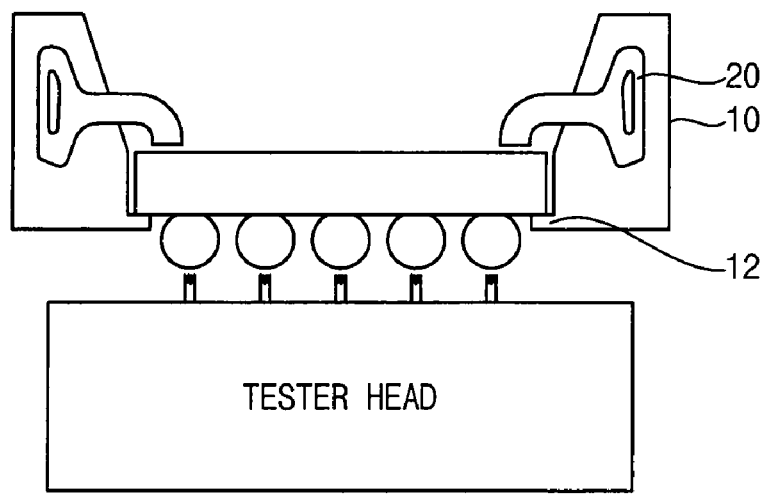
FIG. 2 is a cross-sectional view of a conventional test carrier and a test head.
Figure 3:
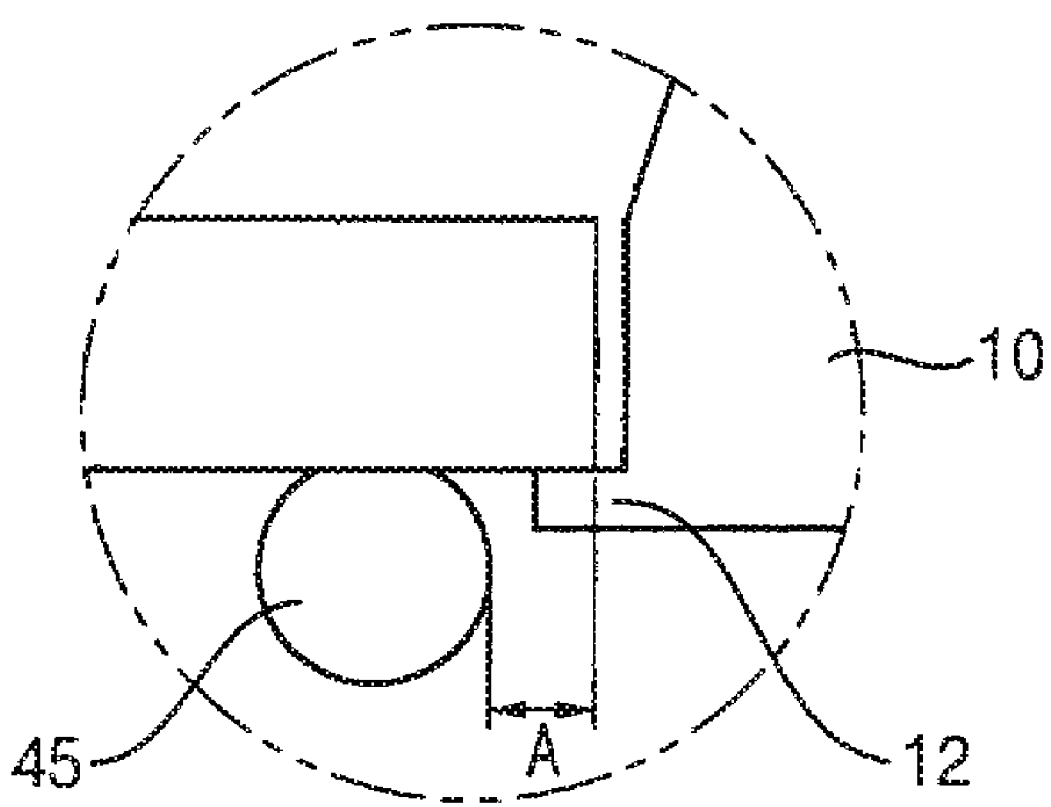
FIG. 3 is an expanded view of a shelf in a conventional test carrier.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations due to, for example, manufacturing techniques and/or tolerances, are to be expected. Thus, example embodiments of the present invention should not be construed as limited to the particular shapes of components illustrated herein but are to include deviations in shapes that result, for example, from manufacturing. Thus, the components illustrated in the figures are schematic in nature and their shapes are not intended to illustrate the actual shape of a component of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4A:
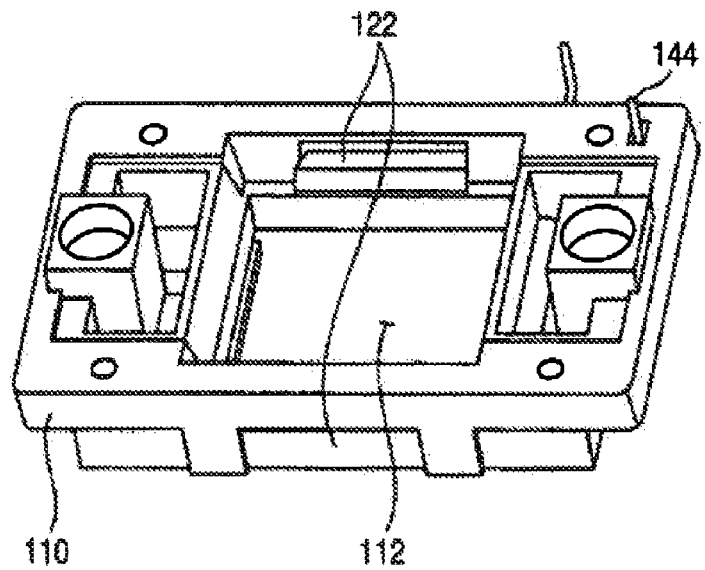
FIGS. 4a and 4b are perspective views of a test carrier according to some embodiments of the invention.
Figure 4B:
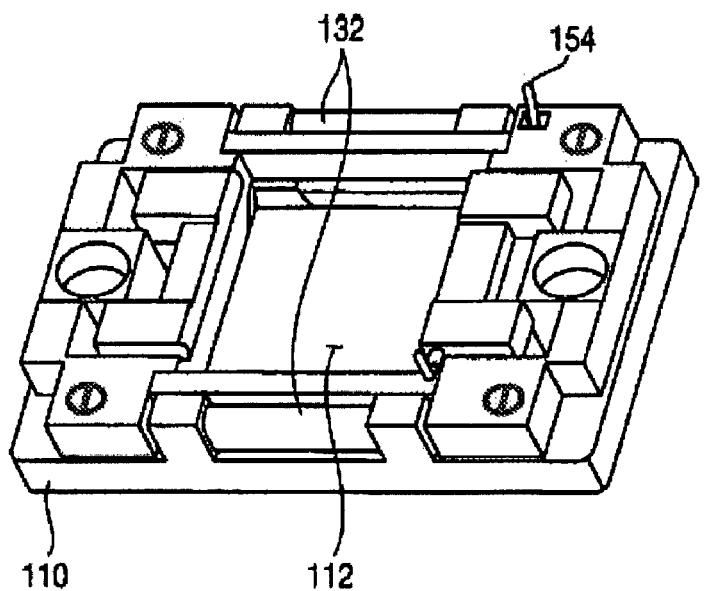

FIGS. 4a and 4b are perspective views of a test carrier according to some embodiments of the invention.

Referring to FIGS. 4a and 4b, a test carrier 100 may include a pair of first latches 122. Also, the test carrier 100 may include a pair of second latches 132. The test carrier 100 also includes an insert body 110 and a pocket 112 in the insert body 110. The pocket 112 is configured to receive an electronic component such as a semiconductor package.

The first latches 122 are configured to engage with a top surface of the semiconductor package as is explained further below with respect to, for example, FIG. 6c. The electronic component may be a conventional semiconductor package such as a ball grid array (BGA) package in which external connection terminals such as solder balls are disposed on the bottom surface of the semiconductor package.

Also, the present invention can be applied to other types of semiconductor packages, such as an etched leadless package (ELP) or other similar semiconductor packages. Further, some embodiments of the present invention can be used to test other electronic components such as a known-good-die (KGD), an electronic component for a liquid crystal display (LCD) and a semiconductor wafer before the packaging process is performed.

The second latches 132 are configured to engage with the external connection terminals on the bottom surface of the semiconductor package as will be explained further with respect to FIG. 6C, for example. Because the second latches 132 only need to engage with the external connection terminals on a lower portion, the second latches 132 do not damage the external connection terminals. Further, because the second latches 132 only need to engage with the external terminals on the lower portion, a minimum distance between the edge of the semiconductor package and the external connection terminals is not required as in the prior art.

Figure 5A:
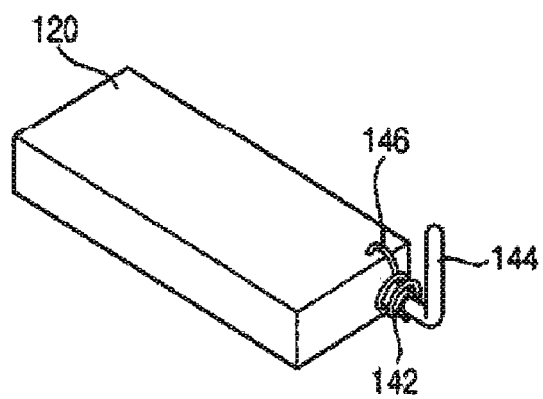
FIGS. 5a and 5b illustrate driving units for first and second latches according to some embodiments of the invention.
Figure 5B:
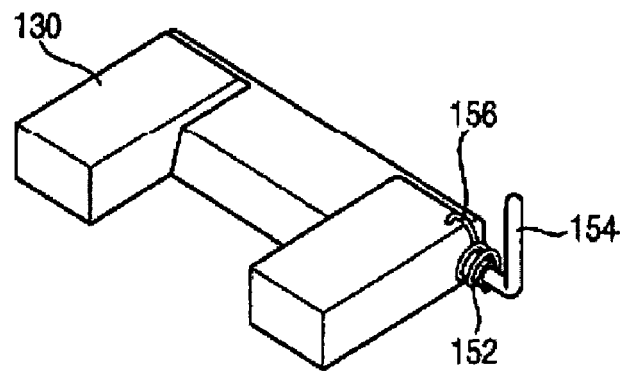

FIGS. 5a and 5b illustrate driving units for first and second latches according to some embodiments of the invention.

Referring to FIG. 5a, a first driving unit 140 is configured to pivot one or more first latches 122 in the same direction against the insert body 110. The first driving unit 140 includes a first hinge unit 142 that connects the first latches 122 to the insert body 110 such that the first latches 122 can simultaneously pivot with respect to the insert body 110 when there is more than one first latch 122. The first driving unit 140 also includes a first lever 144 coupled to the first hinge unit 142. The first lever 144 may protrude from the insert body 110 (FIG. 4a). The first driving unit 140 further includes a spring 146 that supports the first latches 122. The spring 146 is rolled about the first hinge unit 142. The spring 146 can return the first latches 122 to a set position when the first latches 122 are not being actuated. The set position can be either an open position or a closed position.

Referring to FIG. 5b, a second driving unit 150 is configured to pivot one or more second latches 132 with respect to the insert body 110. The second latches 132 support a selected portion of the external connectional terminals of the semiconductor package, for example, a center edge portion of the external connection terminals disposed on the bottom surface of the semiconductor package opposite the top surface of the semiconductor package. The second latches 132 pivot independently of the first latches 122 with respect to the insert body 110.

The second driving unit 150 is configured to pivot the second latches 132 in the same direction with respect to the insert body 110. The second driving unit 150 includes a second hinge unit 152 that connects the second latches 132 to the insert body 110 such that the second latches 132 can simultaneously pivot with respect to the insert body 110 when there is more than one second latch 132. The second driving unit 150 also includes a second lever 154 coupled to the second hinge unit 152. The second lever 154 may protrude from the insert body 110 (FIG. 4b). The second driving unit 150 further includes a spring 156 that supports the second latches 122. The spring 156 is rolled about the second hinge unit 152. The spring 156 can return the second latches 132 to a set position when the first latches 132 are not being actuated. The set position can be either an open position or a closed position.

According to one aspect of the present invention, as the one or more first latches 122 and the one or more second latches 132 pivot independently of each other, the movement of the one or more second latches 132 does not interfere with that of the probes of the test head as further described below with respect to FIG. 6e. During the testing process, the one or more first latches 122 firmly hold the semiconductor packages to be tested in place as further discussed below.

FIGS. 6a through 6e are cross-sectional views of a test carrier illustrating various operating stages according to some embodiments of the present invention.

Referring to FIGS. 6a through 6e, a test carrier 100 includes an insert body 110, first latches 122, and second latches 123. The insert body 110 may have a rectangular shape. However, the insert body does not need to have a rectangular shape as long as the insert body can properly hold a semiconductor package to be tested. The first latches 122 are pivotally attached to the insert body 110 of the test carrier 100, as discussed above. The second latches 132 are also pivotally attached to the insert body 110 of the test carrier 100.

Figure 6A:
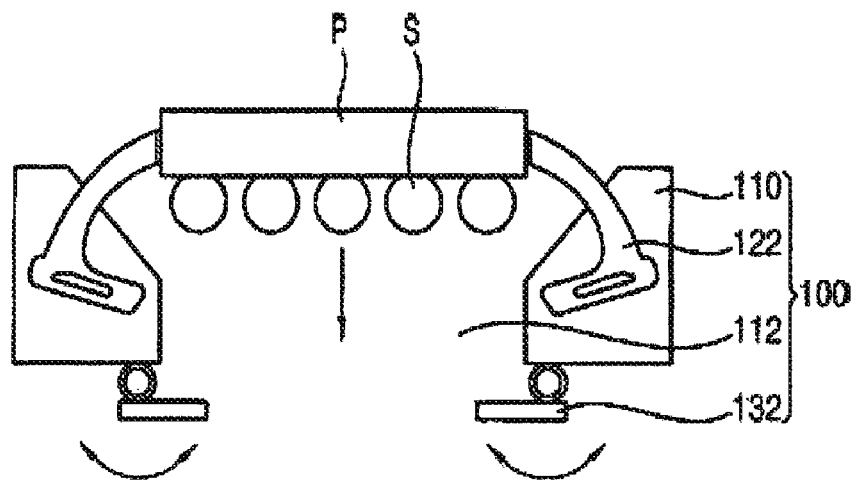
FIGS. 6a through 6e are cross-sectional views of a test carrier illustrating various operating stages according to some embodiments of the present invention.

Referring to FIG. 6a, in order to allow loading of a semiconductor package P, the second latches 132 are pivoted into a closed position to support the semiconductor package P and the first latches 122 are pivoted into the open position by pivoting the first lever 144 of the first driving unit 140. The second latches 132 may engage a center edge portion of the external connection terminal array of the semiconductor package P as shown in, for example, FIG. 7. At this time, the first latches 122 are spaced apart sufficiently for the semiconductor package P to be loaded into the test carrier 100. For example, when the first latches 122 are pivoted into the open position, the distance between an end portion of each of the first latches 122 is greater than a width of the semiconductor package P.

Figure 6B:
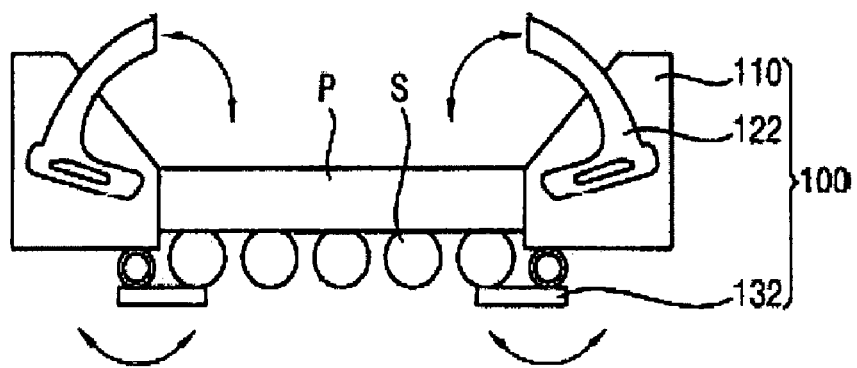

Referring to FIG. 6b, the semiconductor package P is loaded into the test carrier 100. Because the second latches 132 are pivoted into the closed position as discussed above, a portion of the second latches 132 engages with a portion of an external connection terminal array of the semiconductor package P. Because the portion of the second latches 132 only need to contact the bottom portion of the external connection terminals S rather than the sides, the second latches 132 do not damage the external connection terminals S. Also, because the second latches 132 only need to contact the bottom portion of the external connection terminals S, embodiments of the present invention are not affected by the shape of the external connection terminals S. In addition, no minimum distance between the outermost external terminal array and the edge of the semiconductor package needs to be secured as in the prior art.

Figure 6C:
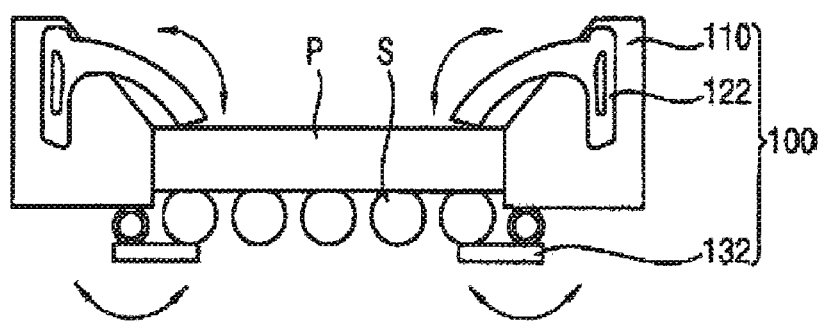

Referring to FIG. 6c, the first latches 122 are pivoted into the closed position as shown. When the first latches 122 are pivoted into the closed position, a portion of the first latches 122 engages with a surface of the semiconductor package P. The first latches 122 may engage a center edge portion of the top surface of the semiconductor package P. Accordingly, the semiconductor package P can be secured in the test carrier 100 by the first latches 122 and the second latches 132.

Figure 6D:
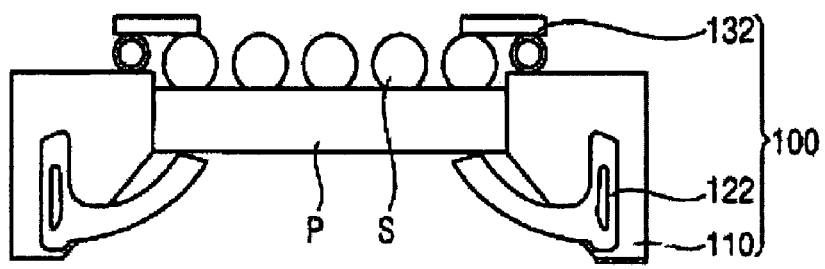

Referring to FIG. 6d, the test carrier 100 is subsequently turned upside down with the first latches 122 and the second latches 132 in the closed position supporting the semiconductor package P. In other words, the test carrier is rotated approximately 180° such that the semiconductor package P is oriented opposite from the direction it was oriented when it was loaded into the test carrier 100. When the first and second latches, 122 and 132, are pivoted into the closed position, the semiconductor package P is held firmly in place and the test carrier 100 can be rotated without the semiconductor package P being displaced from the test carrier 100.

Figure 6E:
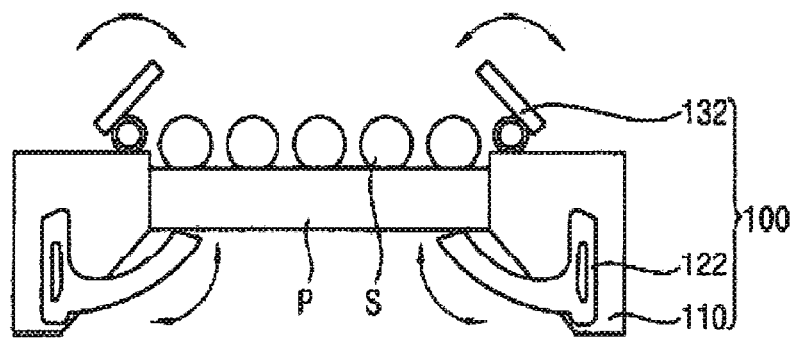

Referring to FIG. 6e, the second latches 132 are pivoted into the open position using the second lever 154, allowing the test carrier 100 to be ready for testing of the semiconductor package P. The first latches 122 remain in the closed position to provide support for the semiconductor package P. At this time, the second latches 132 are spaced apart sufficiently to allow a test head to contact the external connection terminals S of the semiconductor package P. For example, when the second latches 132 are pivoted into the open position a distance between an end portion of each of the second latches 132 is greater than a width of the external connection terminal array of the semiconductor package P. The second latches 132 may pivot between about 0° and about 90°. The test head generates the signals to test electrical characteristics of the semiconductor package P.

In other words, the second latches 132 are configured to engage external connection terminals S of the semiconductor package P when the second latches 132 are pivoted into a first orientation as shown in, for example, FIG. 6a. The second latches 132 are configured to allow a test head to contact the external connection terminals S when the second latches 132 are pivoted into a second orientation as shown in, for example, FIG. 6e. Similarly, when the first latches 122 are pivoted into a third orientation as shown in, for example, FIG. 6e, the first latches 122 are configured to hold the semiconductor package P. Further, the first latches 122 are configured to allow the semiconductor package P to be loaded and unloaded from the test carrier 100 when the first latches 122 are pivoted into a fourth orientation as shown in, for example, FIG. 6a.

According to one aspect of the present invention, the first and second latches 122 and 132 can operate independently during the above described operating steps.

In accordance with an embodiment of the present invention, a method of testing a semiconductor device can be summarized as follows. The method includes providing a test carrier 100 including a first latch assembly having one or more first latches 122 and a second latch assembly having one or more second latches 132.

When the test carrier 100 is provided, the first latches 122 are pivoted to the open position and the second latches 132 of the second latch assembly are pivoted to the closed position as shown in FIG. 6a. In the open position, the first latches 122 pivot toward the insert body 110, i.e., an upward direction in FIG. 6a, such that the pocket 112 of the insert body 110 is open to receive the semiconductor package P. In the closed position of the second latches 132, the second latches 132 pivot away from the insert body, i.e., an upward direction in FIG. 6a such that they can support the semiconductor package P.

The semiconductor package P is then placed on the test carrier 100 within the pocket 112 such that the semiconductor package P can engage with or rest on the second latches 132 of the second latch assembly as shown in FIG. 6b. At this time, the external connection terminals S of the semiconductor package P face toward the second latches 132. As a result, the second latches 132 can support selected portions of the external connection terminals S of the semiconductor package P.

Then, the first latches 122 of the first latch assembly are also pivoted into the closed position as shown in FIG. 6c. As a result, the first latches 122 and the second latches 132 are in the closed position. Consequently, the semiconductor package P can be held firmly in place by both the first latches 122 and the second latches 132.

Referring to FIG. 6d, the test carrier is then turned upside down as shown in FIG. 6d. As discussed above, the semiconductor package P may be loaded into the test carrier 100 in a way that the external connection terminals S of the semiconductor package P face downwardly. Once the test carrier 100 is rotated, the external connection terminals S of the semiconductor package P face upwardly. It would be appreciated by one of ordinary skill in the art that orientations different from, or opposite to, those described above are also included within the spirit and scope of the present invention.

Next, the second latches 132 are pivoted to the open position so that the external connection terminals S of the semiconductor package P are exposed without being blocked or obscured by the second latches 132, as shown in FIG. 6e. A test head can then be engaged with the external connection terminals S of the semiconductor package P, as further described below.

Figure 7:
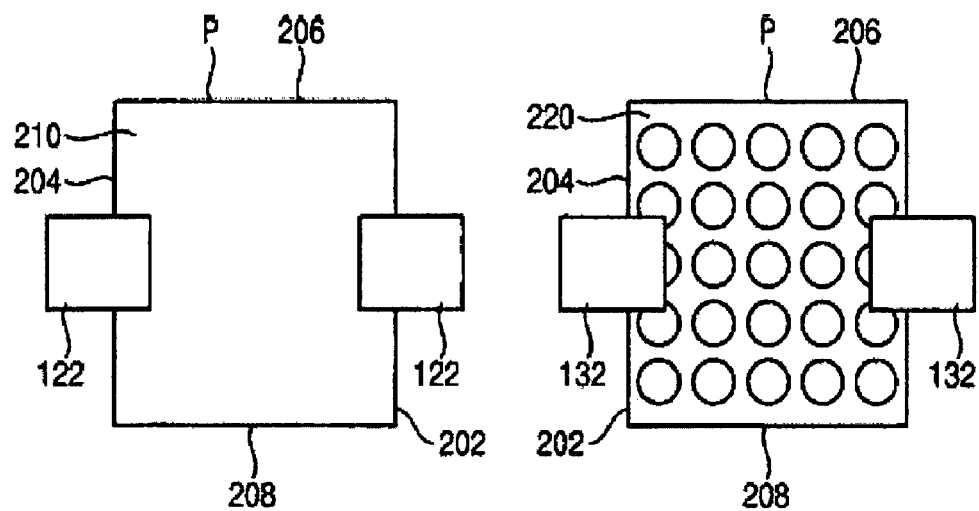
FIG. 7 is a plan view of a semiconductor package engaged with first and second latches according to some embodiments of the present invention.

FIG. 7 is a plan view of a semiconductor package engaged with first and second latches according to some embodiments of the present invention.

Referring to FIG. 7, the semiconductor package P has a first side 202, a second side 204 opposite to the first side 202, a third side adjacent 206 to the first side 202, and a fourth side 208 opposite to the third side 206. The first latches 122 are engaged with a top surface 210 of the semiconductor package P on the first and second sides, 202 and 204, of the top surface 210. Further, the second latches 132 are engaged with the external connection terminal array on a bottom surface 220 of the semiconductor package P such that the second latches 132 engage the semiconductor package P on the first and second sides, 202 and 204, of the semiconductor package P.

According to the embodiment shown in FIG. 10, the first latches 122 and the second latches 132 engage the semiconductor package P on corresponding sides of the semiconductor package P. In other words, the first latches 122 and the second latches 132 both engage the semiconductor package P on the first and second sides, 202 and 204.

Figure 8A:
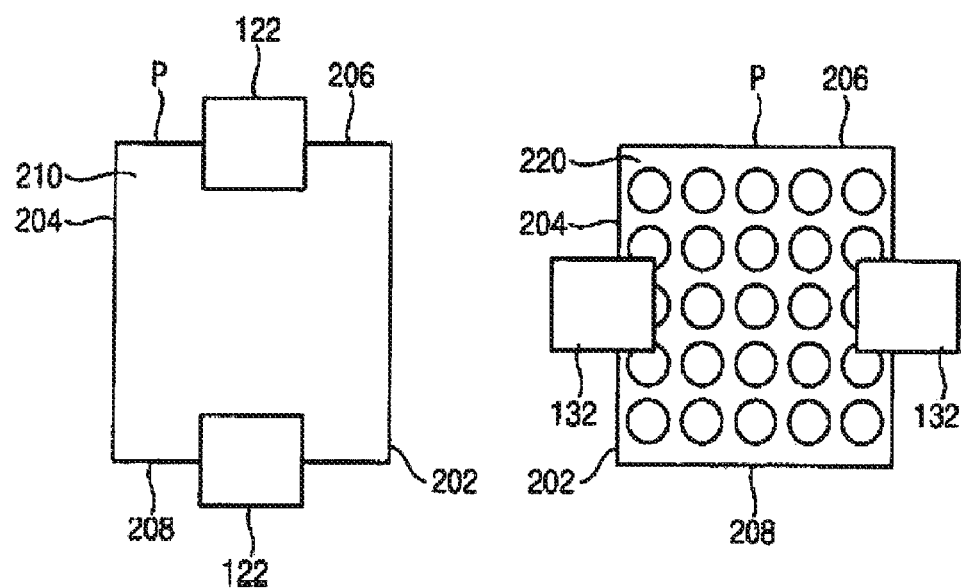
FIGS. 8a and 8b are plan views of a semiconductor package engaged with first and second latches according to other embodiments of the present invention.
Figure 8B:
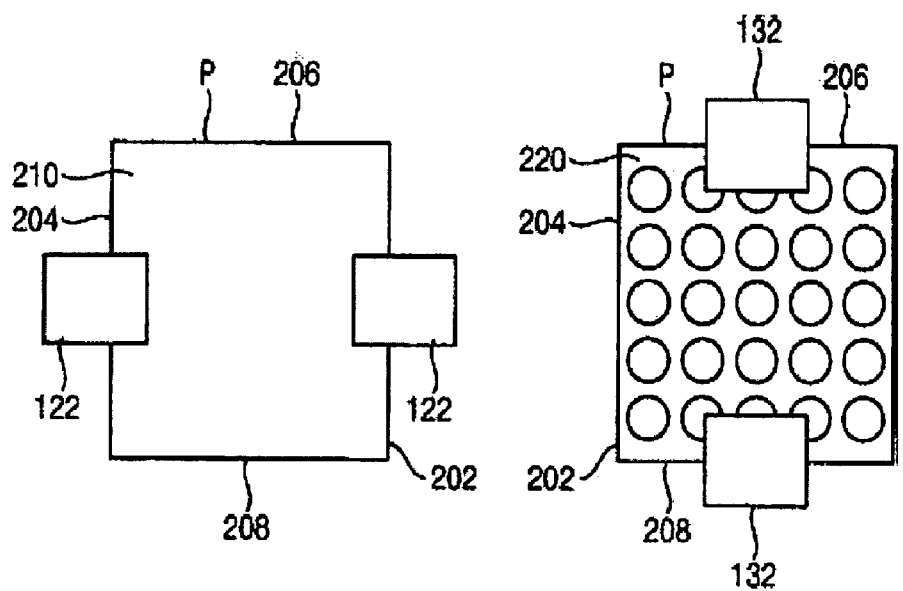

FIGS. 8a and 8b are plan views of a semiconductor package engaged with first and second latches according to other embodiments of the present invention.

Referring to FIGS. 8a and 8b, the first and second latches, 122 and 132, may engage the semiconductor package P on opposite sides from each other. For instance, the first latches 122 may engage the top surface 210 of the semiconductor package P on the third and fourth sides, 206 and 208, of the semiconductor package P, while the second latches 132 engage the semiconductor package P on the first and second sides, 202 and 204, as shown in FIG. 8a.

Alternatively, the first latches 122 of the first latch assembly 120 may engage the top surface 210 of the semiconductor package P on the first and second sides, 202 and 204, of the semiconductor package P, while the second latches 132 of the second latch assembly 130 engage the semiconductor package P on the third and fourth sides, 206 and 208, as shown in FIG. 8b. One of ordinary skill in the art would appreciate that other orientations of the first and second latches, 122 and 132, are included within the spirit and scope of the present invention.

Although the present invention has been described with the first and second latches engaging sides of a semiconductor package, a person of ordinary skill in the art will appreciate that the first and/or second latches can also engage one or more corners of the semiconductor package as discussed immediately below.

Figure 9A:
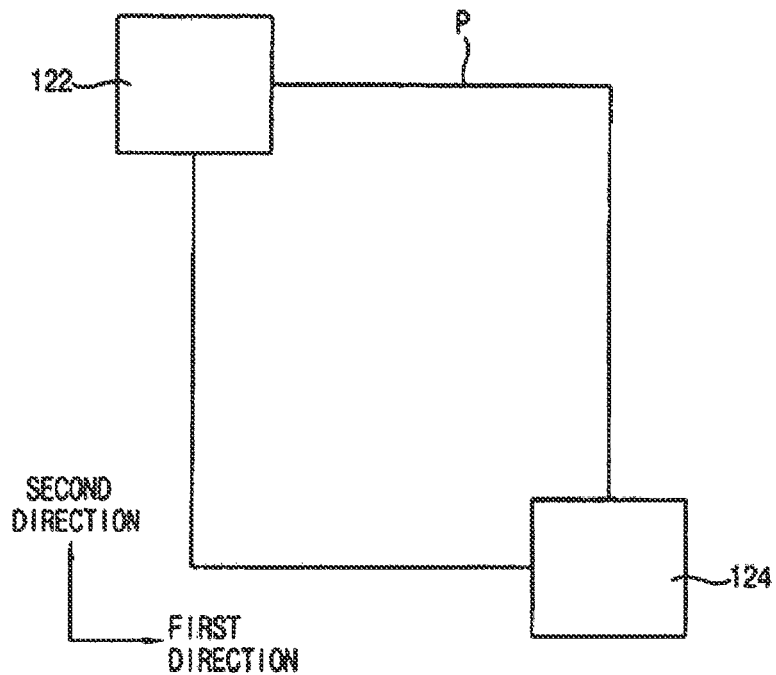
FIGS. 9a and 9b are plan views of a semiconductor package engaged with first and second latches according to other embodiments of the present invention.
Figure 9B:
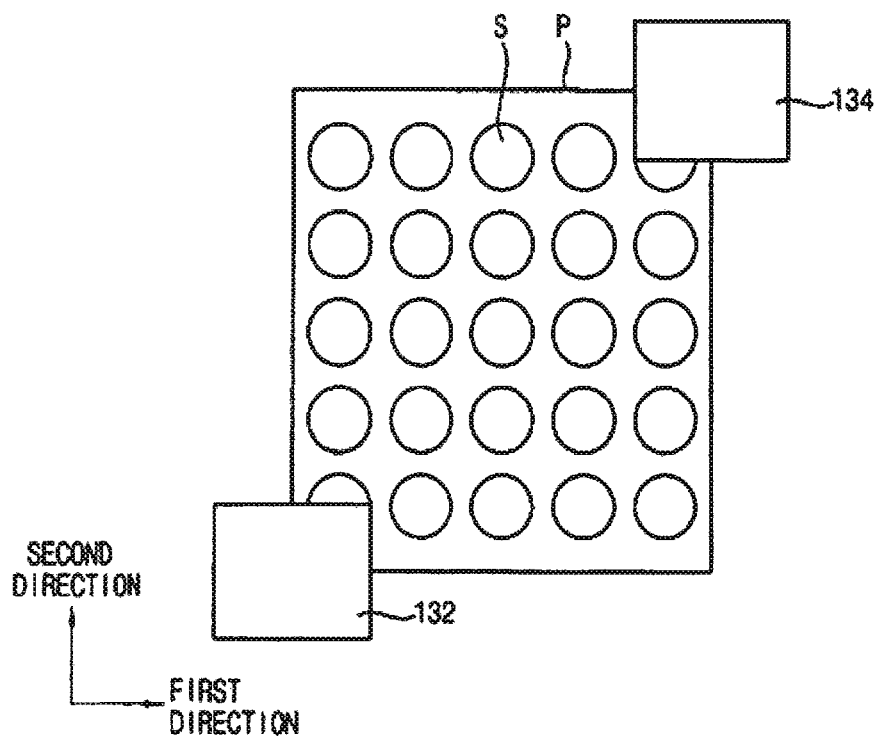

FIGS. 9a and 9b are plan views of a semiconductor package engaged with first and second latches according to other embodiments of the present invention.

Referring to FIGS. 9a and 9b, one or more first latches 122 may be pivoted to position along a first diagonal direction on opposite corners of the top surface of the semiconductor package P. Further, one or more second latches 132 may be pivoted to position along a second diagonal direction on opposite corners of the bottom surface of the semiconductor package P. Alternatively, the first and second latches 122 and 132 can be disposed so as to engage the semiconductor package P at corners in the same diagonal direction.

Figure 10A:
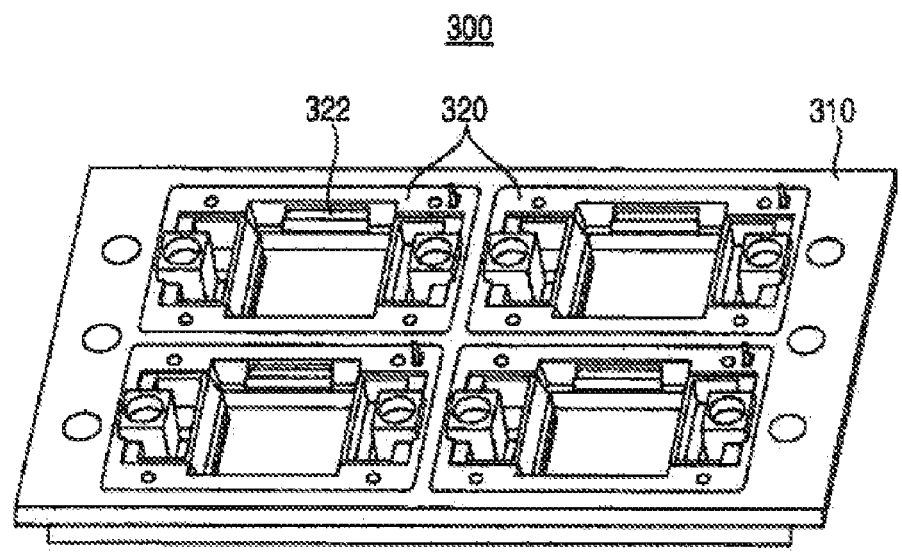
FIGS. 10a and 10b are perspective views of a test carrier board for testing semiconductor devices according to some embodiments of the present invention.
Figure 10B:
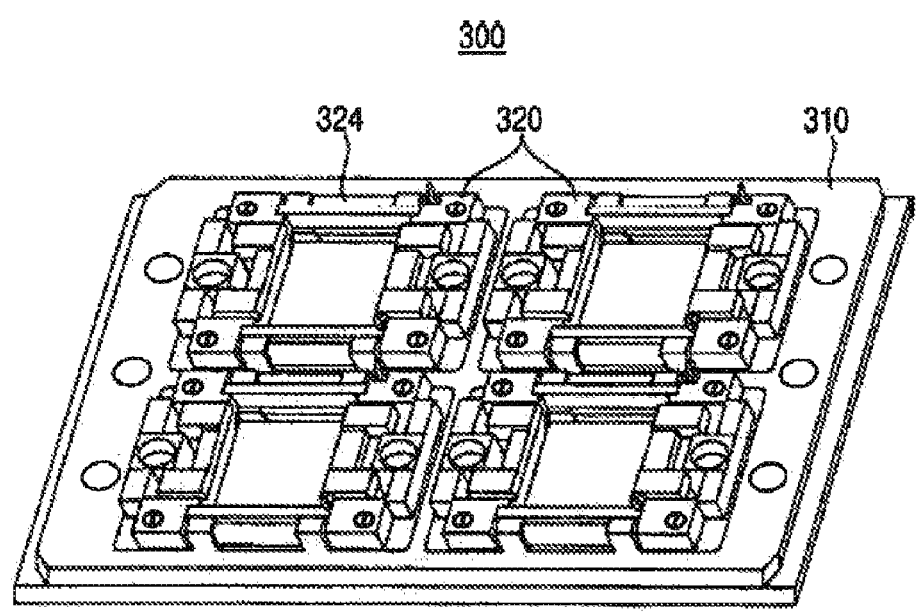

FIGS. 10a and 10b are perspective views of a test carrier board for testing semiconductor devices according to some embodiments of the present invention.

Referring to FIGS. 10a and 10b, a test carrier board 300 includes a frame 310 and a plurality of test carriers 320. The test carriers 320 may be similar to the test carrier 100 described above. The test carriers 320 are arranged in an array and are configured to engage with a test head so that a plurality of semiconductor devices can be tested at the same time. Each of the plurality of test carriers 320 may include a first latch assembly having first latches 322 and a second latch assembly having second latches 324.

When the first latches 322 are in the open position and the second latches 324 are in the closed position, a semiconductor package can be loaded into the test carrier 320 as in the previously discussed embodiments. When the first latches 322 are in the closed position and the second latches 324 are in the open position, the semiconductor packages can be engaged with the test head for electrical testing. When the first and second latches, 322 and 324, are in the closed position, the semiconductor packages are held firmly in place so that the test carrier 320 can be rotated without the semiconductor packages becoming dislodged from the test carriers 320.

Figure 11:
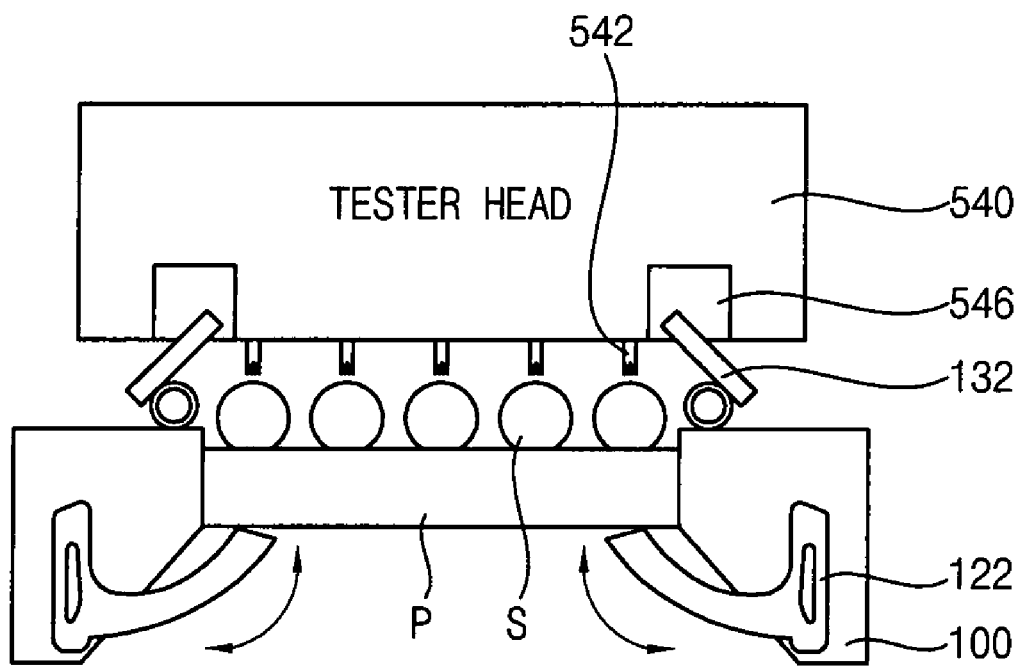
FIG. 11 is a cross-sectional view of a testing system according to some embodiments of the invention.

FIG. 11 is a cross-sectional view of a testing system according to some embodiments of the invention.

Referring to FIG. 11, a testing system includes a test head 540 and a test carrier 100. The test carrier 100 can be included in a test carrier board as discussed above with respect to FIG. 10. The test carrier 100 includes a first latch assembly having first latches 122 and a second latch assembly having second latches 132. The test head 540 can engage with the external connection terminals of an electronic component, e.g., a semiconductor package P, held in the test carrier 100. In general, a semiconductor device (not separately illustrated) is encapsulated in the semiconductor package P. The test head 540 can engage with the semiconductor package from, e.g., top to bottom along a vertical direction. Thus, the test head 540 can be located above the semiconductor package P to be tested.

The test head 540 includes a plurality of test probes or test pins 542, which also may be referred to as pogo pins, which electrically connect with the external connection terminals S of the semiconductor package P to allow electrical signals to be exchanged between the test head 540 and the semiconductor device in the semiconductor package P. The test head 540 may include cavities 546 that correspond to the second latches 132 of the second latch assembly to accommodate the second latches 132 in the open position, but this is not required.

In accordance with an embodiment of the present invention discussed above, a tester 500 or test equipment can be summarized as follows. The tester 500 includes a test head 540 which includes probes 544 and a test carrier 100. The test carrier 100 may be disposed below the test head 540. As a result, external connection terminals (e.g., solder balls) of the semiconductor package P are disposed so as to face the test head 540.

Accordingly, the first latches 122 selectively support the top surface of the semiconductor package P during testing and the second latches 132 selectively support the external connection terminals before the testing operation, and before the second latches 132 are pivoted into an open position to accommodate the test head 540, as shown in FIG. 10.

As described above, according to some embodiments of the invention, a test carrier has first and second latch assemblies that engage first and second surfaces of a semiconductor package. Therefore, a minimum distance (indicated as A in the prior art) between the external connection terminal array and the edge of the encapsulation of the semiconductor package is not required in order to test a semiconductor device with some embodiments of the present invention. Further, because the latch assemblies only engage a portion of a bottom surface of the external connection terminals, the latch assemblies do not damage the external connection terminals.

Consequently, semiconductor packages having more external connection terminals and various configurations of external connection terminals, such as etched leadless packages (ELP), can be tested using embodiments of the invention without being restricted by a minimum distance A between the edge of the encapsulation and the edge of the external connection terminal array as in the prior art. This is particularly true as the testing can be performed while the second latches are in an open position (therefore the latches do not interfere with or are not in the way of the test head and/or external connection terminals). Thus, the present invention provides advantages in the scaling down of semiconductor packages to meet consumer demand for smaller, higher-performance devices. Also, the present invention can accommodate semiconductor packages with very high pin counts for the reasons discussed above.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A test carrier, comprising:
an insert body;
a first latch assembly including one or more first latches pivotally attached to the insert body, the first latch assembly configured to hold a first surface of an electronic component to be tested; and
a second latch assembly including one or more second latches pivotally attached to the insert body, the second latch assembly configured to hold a second surface of the electronic component opposite to the first surface,
wherein the second latch assembly is configured to engage with an external connection terminal array of the electronic component and wherein the first latch assembly and the second latch assembly pivot independently of each other.

2. The test carrier of claim 1, wherein the second latch assembly is configured to pivot into an open position to permit contact between a test head and the external connection terminal array during testing of the electronic component.

3. The test carrier of claim 2, wherein the first latch assembly is configured to pivot into a closed position to hold the electronic component during testing of the electronic component.

4. The test carrier of claim 1, wherein the first latch assembly is configured to pivot into an open position such that the electronic component is receivable within a pocket of the test carrier.

5. The test carrier of claim 1, wherein the first latches are configured to engage the first surface of the electronic component on the first and second sides thereof and wherein the second latches are configured to engage with the external connection terminal array on the first and second sides of the second surface of the electronic component.

6. The test carrier of claim 1, wherein the first latches are configured to engage the first surface of the electronic component on the third and fourth sides thereof and wherein the second latches are configured to engage with the external connection terminal array on the first and second sides of the second surface of the electronic component.

7. The test carrier of claim 1, wherein the first latches are configured to engage the first surface of the electronic component on the first and second sides of the first surface and wherein the second latches are configured to engage with the external connection terminal array on the third and fourth sides of the second surface of the electronic component.

8. The test carrier of claim 1, wherein the first latches are configured to engage the first surface of the electronic component at corners of the first surface and wherein the second latches are configured to engage with the external connection terminal array at corners of the second surface of the electronic component.

9. The test carrier of claim 1, wherein the first latch assembly is configured such that when the first latches are open, a distance between an end portion of each of the first latches is greater than a width of the electronic component.

10. The test carrier of claim 1, wherein the second latch assembly is configured such that when the second latches are open, a distance between an end portion of each of the second latches is greater than a width of the external connection terminal array.

11. A semiconductor device test system, comprising:
a test head; and
a test carrier board, the test carrier board including:
a frame; and
a plurality of test carriers, wherein each of the test carriers includes a first latch assembly and a second latch assembly and wherein the first latch assemblies are configured to engage top surfaces of electronic components and the second latch assemblies are configured to engage external connection terminals of the electronic components,
wherein the test carriers are configured to be in a first orientation when loading and unloading the electronic components and a second orientation when engaging with the test head to test the semiconductor devices and wherein the second orientation is rotated about 180° from the first orientation.

* * * * *